United States Patent
Wassink

(10) Patent No.: US 8,018,576 B2
(45) Date of Patent: Sep. 13, 2011

(54) CONTAMINATION PREVENTION SYSTEM, A LITHOGRAPHIC APPARATUS, A RADIATION SOURCE AND A METHOD FOR MANUFACTURING A DEVICE

(75) Inventor: Arnoud Cornelis Wassink, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 685 days.

(21) Appl. No.: 11/727,166

(22) Filed: Mar. 23, 2007

(65) Prior Publication Data

US 2008/0231820 A1     Sep. 25, 2008

(51) Int. Cl.
G03B 27/42     (2006.01)
(52) U.S. Cl. ............................................. 355/53; 355/30
(58) Field of Classification Search ............... 355/30, 355/53; 250/504 R, 492.1, 492.2
See application file for complete search history.

(56) References Cited

U.S. PATENT DOCUMENTS

| | | | |
|---|---|---|---|
| 2005/0098741 A1 | 5/2005 | Bakker et al. | |
| 2006/0175558 A1* | 8/2006 | Bakker et al. | 250/492.2 |
| 2006/0243927 A1 | 11/2006 | Tran et al. | |

FOREIGN PATENT DOCUMENTS

| | | |
|---|---|---|
| EP | 1 677 149 A1 | 7/2006 |
| JP | 2007-5542 A | 1/2007 |
| WO | WO 2008/035965 A2 | 3/2008 |

OTHER PUBLICATIONS

International Search Report and Written Opinion for International Application No. PCT/NL2008/050160 dated Jun. 27, 2008.

* cited by examiner

Primary Examiner — Edward Glick
Assistant Examiner — Mesfin T Asfaw
(74) Attorney, Agent, or Firm — Pillsbury Winthrop Shaw Pittman LLP

(57) ABSTRACT

A contamination prevention system constructed and arranged to prevent material emanating from a radiation source from propagating with radiation from the radiation source into or within a lithographic apparatus. The contamination prevention system includes a channel barrier constructed and arranged to traverse the radiation from the radiation source. The channel barrier includes a plurality of elongated channel members constructed and arranged to absorb or deflect the material. The channel members are rotatable around an axis of rotation by a drive connected to the channel barrier. The contamination prevention system also includes a cooling system provided on an outer surface of the channel barrier.

18 Claims, 8 Drawing Sheets

CONTAMINATION PREVENTION SYSTEM, A LITHOGRAPHIC APPARATUS, A RADIATION SOURCE AND A METHOD FOR MANUFACTURING A DEVICE

FIELD

The invention relates to a contamination prevention system, a lithographic projection apparatus, a radiation source and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

The term "patterning device" as here employed should be broadly interpreted as referring to device that can be used to endow an incoming radiation beam with a patterned cross-section, corresponding to a pattern that is to be created in a target portion of the substrate. The term 'light valve' can also be used in this context. Generally, the pattern will correspond to a particular functional layer in a device being created in the target portion, such as an integrated circuit or other device. An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in case of a transmissive mask) or reflection (in the case of a reflective mask) of the radiation impinging on the mask, according to the pattern of the mask. In the case of a mask, the support structure will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this way, the beam is patterned according to the addressing pattern of the matrix-addressable mirrors. The requires matrix addressing can be performed using suitable electronics. In both of the situations described hereabove, the patterning device can comprise one or more programmable mirror arrays. In the case of the programmable mirror array, the support structure may be embodied as a frame or table, for example, which may be fixed or movable as required.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time.

In a known manufacturing process using a lithographic projection apparatus, a pattern (e.g. mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are desired, then the whole procedure, or a variant thereof, will need to be repeated for each new layer. It is desirable to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices (refereed to hereinafter as 'alignment system'), this mark can then be relocated each time a new layer has to be juxtaposed on an existing layer, and can be used as an alignment reference. Eventually, an array of devices will be present on the substrate (wafer). These devices are than separated from one another by a technique such as dicing or sawing, when the individual devices can be mounted on a carrier, connected to pins, etc.

For the sake of simplicity, the projection system may hereinafter be referred to as the 'lens'. However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a 'lens'. Further, the lithographic apparatus may be of a type having two or more substrate tables (and/or two or more mask tables). In such 'multiple stage' devices, the additional tables my be used in parallel or preparatory steps may be carried out on one or more tables, while one or more other tables are being used for exposures. This technique is called dual stage lithography and is known per se in the art.

In a lithographic apparatus, the size of features that can be imaged on the substrate is somewhat limited by wavelength of the projection radiation. To produce integrated circuits with a higher density of devices, and hence higher operating speeds, it is desirable to be able to image smaller features. While most current lithographic projection apparatus employ ultraviolet light generated by mercury lamps or excimer lasers, it has been proposed to use shorter wavelength radiation in the range 5 to 20 nm, especially around 13 nm. Such radiation is termed extreme ultraviolet (EUV) or soft X-ray and suitable sources include, for example, laser-produced plasma sources, discharge plasma sources or synchrotron radiation from electron storage rings.

In a discharge plasma source, for example, a discharge is created in between electrodes, and a resulting partially ionized plasma may subsequently be caused to collapse to yield a very hot plasma that emits radiation in the EUV range. Sn, Li and Xe plasmas may be used to radiate in the extreme UV (EUV) range around 13.5 nm.

In addition to EUV radiation, radiation sources used in EUV radiation systems may generate contaminant material that is harmful for the optics and the working environment in which the lithographic process is carried out. Such a radiation system typically comprises a pair of electrodes to which a voltage difference can be applied. In addition, plasma is produced, for example, by a laser beam that is targeted to for example, one of the electrodes. Accordingly, a discharge will occur between the electrodes, which causes a so-called pinch in which EUV radiation is produced. In addition to this radiation, the discharge source typically produces debris particles, which can be all kinds of micro particles varying in size from atomic to complex particles, which can be both charged and uncharged.

It is desired to shield the optical system that is arranged to condition the beam of radiation coming from the EUV radiation source from this debris. Shielding of the optical system is done with a contamination preventing system for preventing material (debris) emanating from the source from propagating with the EUV radiation into the lithography apparatus.

Another product of the source is heat, which causes the contamination prevention system to heat up. This heating up may especially be the case if the size of the contamination prevention system is enlarged to collect radiation over larger collection angles of the source, and is unwanted because heating up may cause malfunction of the contamination prevention system.

SUMMARY

It is an aspect of the invention to provide a contamination prevention system in which debris mitigation is successfully achieved even with higher heat loads to the contamination prevention system.

According to an aspect of the invention there is provided a contamination prevention system constructed and arranged to prevent material emanating from a radiation source from propagating with radiation from the radiation source into or within a lithographic apparatus. The contamination prevention system includes a channel barrier constructed and arranged to traverse the radiation from the radiation source. The channel barrier includes a plurality of elongated channel members constructed and arranged to absorb or deflect the material. The channel members are rotatable around an axis of rotation by a drive connected to the channel barrier. The contamination prevention system also includes a cooling system provided on an outer surface of the channel barrier.

According to another aspect of the invention, there is provided a lithographic projection apparatus that includes a radiation source constructed and arranged to generate radiation, and a contamination prevention system constructed and arranged to prevent material emanating from the radiation source from propagating with the radiation within a lithographic apparatus. The contamination prevention system includes a channel barrier constructed and arranged to traverse the radiation from the radiation source. The channel barrier includes a plurality of elongated channel members constructed and arranged to absorb or deflect the material. The channel members are rotatable around an axis of rotation by a drive connected to the channel barrier. The contamination prevention system also includes a cooling system provided on an outer surface of the channel barrier. The lithographic projection apparatus also includes a patterning device constructed and arranged to pattern the radiation, and a projection system constructed and arranged to project the patterned radiation onto a substrate at least partially covered with a radiation sensitive material.

According to another aspect of the invention, there is provided a radiation system for a lithographic apparatus. The radiation system includes a radiation source constructed and arranged to generate radiation, and a contamination prevention system constructed and arranged to prevent material emanating from the radiation source from propagating with the radiation into or within a lithographic apparatus. The contamination prevention system includes a channel barrier constructed and arranged to traverse the radiation from the radiation source. The channel barrier includes a plurality of elongated channel members constructed and arranged to absorb or deflect the material. The channel members are rotatable around an axis of rotation by a drive connected to the channel barrier. The contamination prevention system also includes a cooling system provided on an outer surface of the channel barrier.

According to a further aspect of the invention, there is provided a method of manufacturing an integrated structure by a lithographic process. The method includes generating radiation with a radiation source, preventing material emanating from the radiation source from propagating with the radiation with a contamination prevention system, cooling the contamination prevention system with a cooling system, patterning the radiation, and projecting the patterned radiation onto a target portion of a substrate at least partially covered with a radiation sensitive material.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
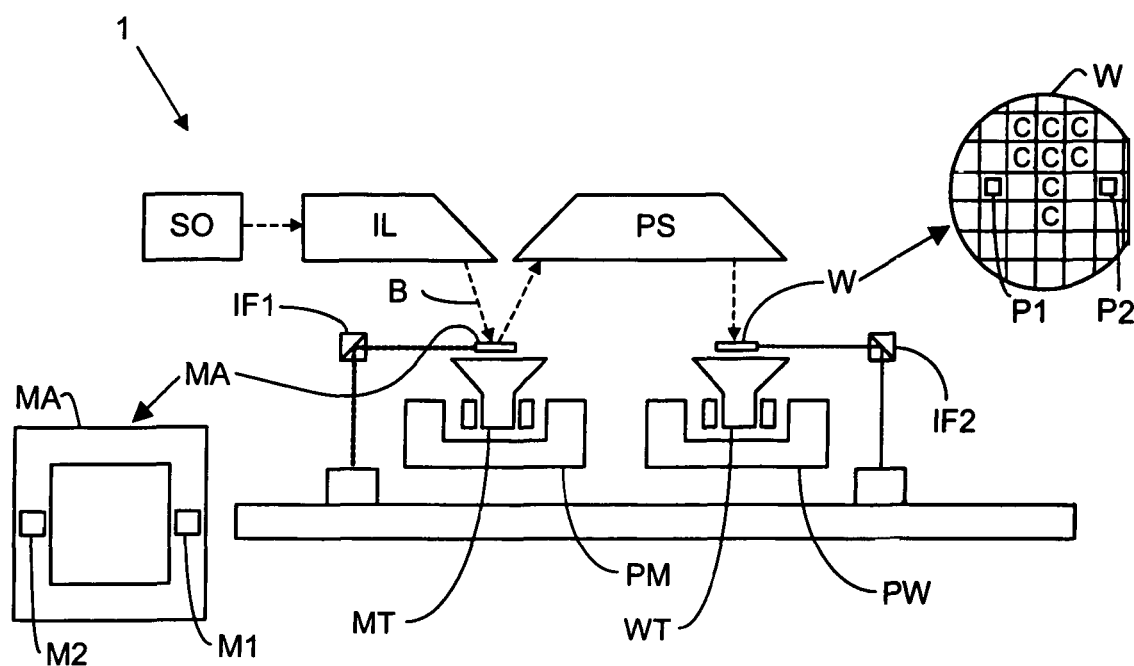
FIG. 1 depicts a lithographic apparatus according to an embodiment of the invention.

FIG. 1 schematically depicts a lithographic apparatus according to an embodiment of the invention. The apparatus comprises: an illumination system (illuminator) IL configured to condition a radiation beam B (e.g. UV radiation or EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus, for example when the source is a mercury lamp. The source SO and the illuminator IL, together with the beam delivery system if required, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
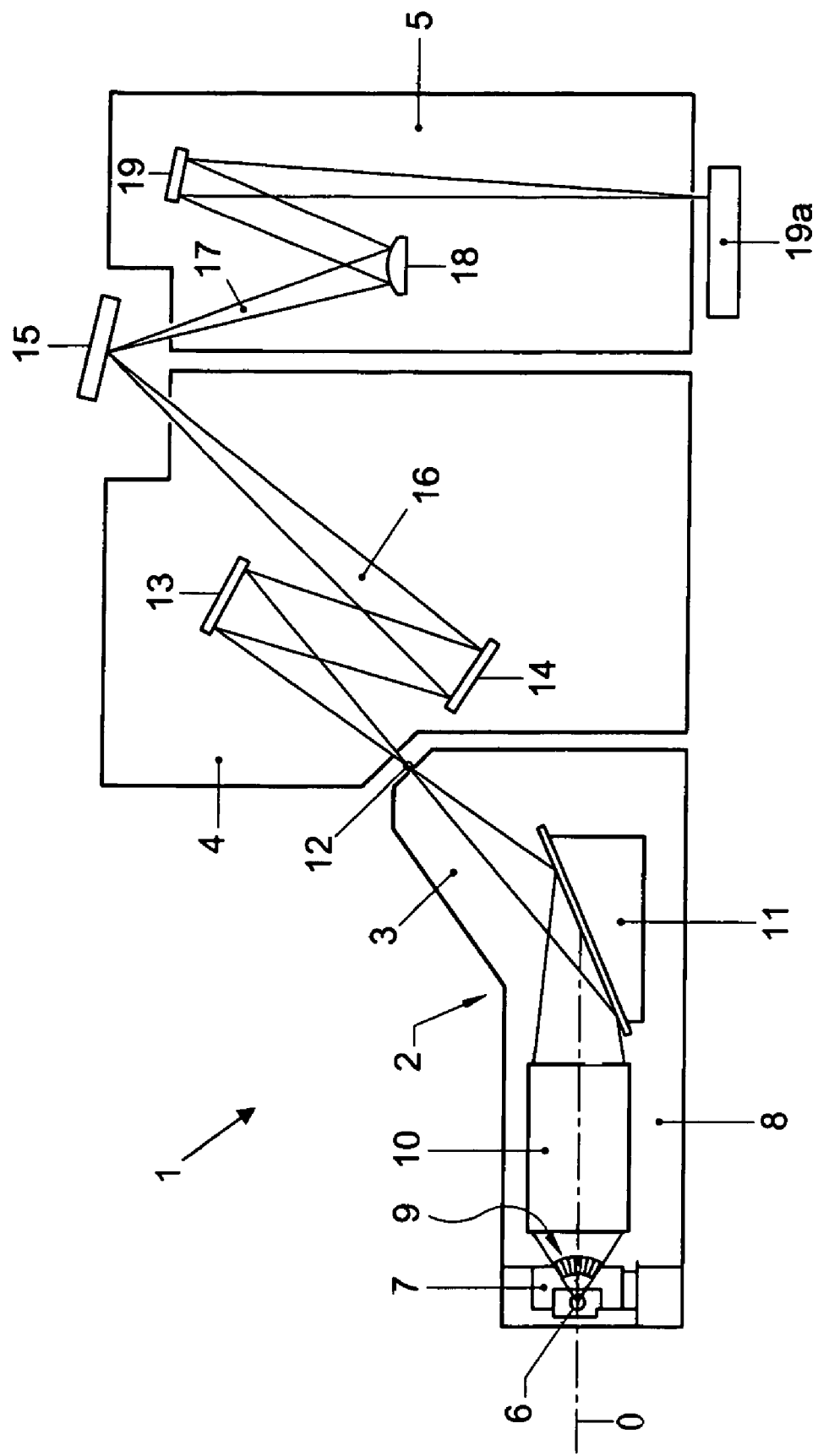
FIG. 2 presents schematically an embodiment of the lithographic apparatus of FIG. 1 that includes an illumination system and a source-collector module.

FIG. 2 presents schematically an embodiment of the lithographic apparatus comprising an illumination system and a source-collector module. The lithographic projection apparatus 1 comprises an illumination system with a source-collector module or radiation unit 3, illumination optics unit 4, and projection optics system 5. A radiation system 2 includes the source-collector module or radiation unit 3 and the illumination optics unit 4. The radiation unit 3 may be provided with an EUV radiation source 6 which may be formed by a single plasma. The EUV radiation source 6 may employ a gas or vapor, such as Xe gas or Li or Sn vapor in which a very hot plasma is created by causing a partially ionized plasma of an electrical discharge to collapse onto the optical axis O. Partial pressures of 0.1 mbar Xe, Li vapor or any other suitable gas or vapor may be required for efficient generation of radiation. The radiation emitted by radiation source 6 is passed from the source chamber 7 into collector chamber 8 via a contamination prevention system e.g. gas barrier or foil trap 9, also referred to as the channel barrier. The collector chamber 8 includes a radiation collector 10, which according to the present invention, is formed by a grazing incidence collector. Radiation passed by collector 10 is reflected off a grating spectral filter 11 or mirror to be focused in a virtual source point 12 at an aperture in the collector chamber 8. From chamber 8, a radiation beam 16 is reflected in illumination optics unit 4 via normal incidence reflectors 13, 14 onto a reticle or mask positioned on reticle or mask table 15. A patterned beam 17 is formed which is imaged in projection optics system 5 via reflective elements 18, 19 onto wafer stage or substrate table 19a. It is noted that more elements than shown may generally be present in illumination optics unit 4 and projection system 5.

Figure 3:
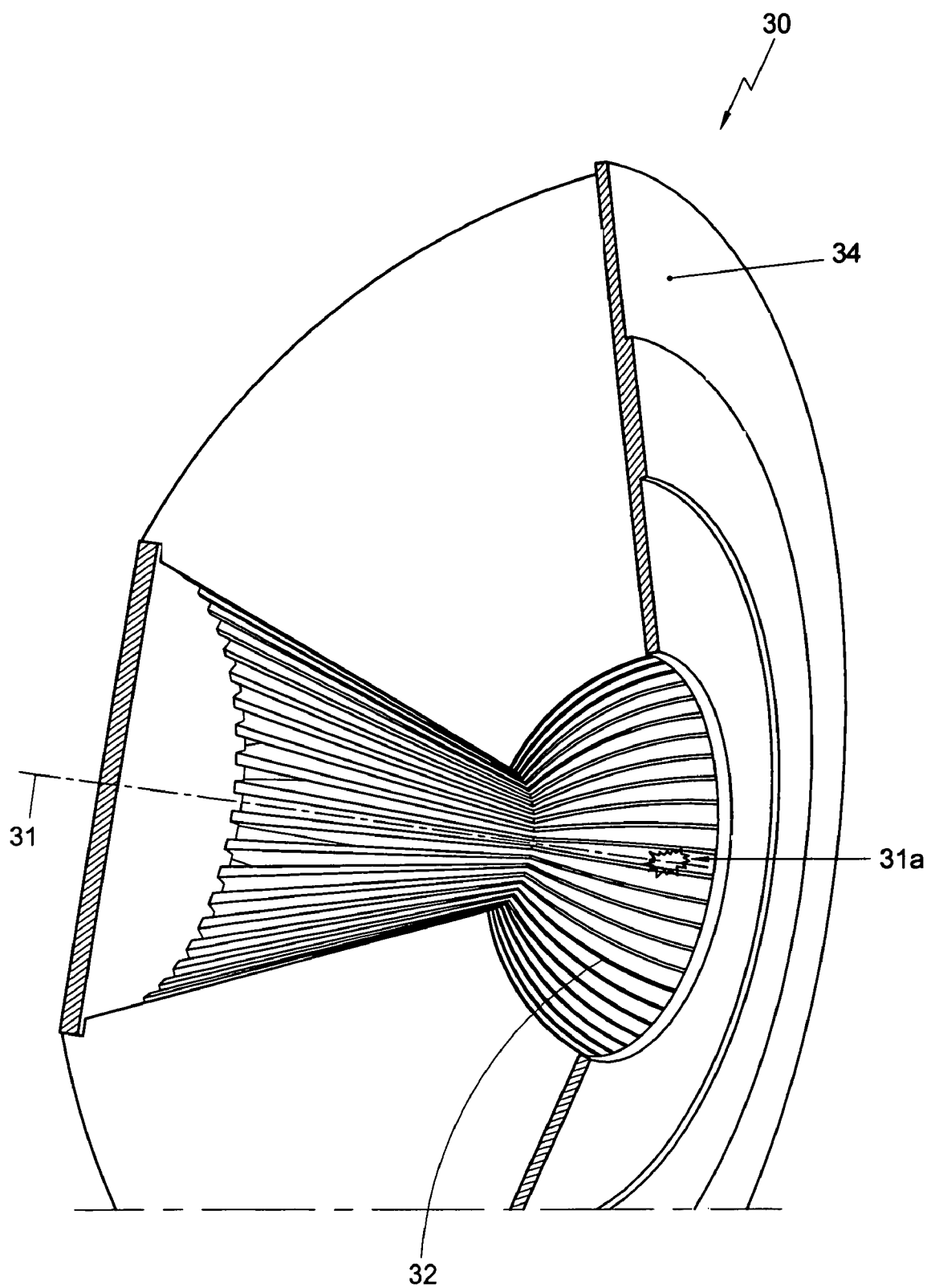
FIG. 3 presents schematically an embodiment of a channel barrier.

An embodiment of a contamination prevention system e.g. rotating channel barrier 30 according to an aspect of the invention is schematically depicted in FIG. 3. The radiation beam (not shown) emanates from the EUV source 31a. The channel barrier comprises a plurality of elongated channel members 32 being arranged around an axis of rotation 31 around which the channel barrier is rotated. Each channel member 32 has a width direction transverse to the axis of rotation and a length direction extending generally parallel to the direction of the axis of rotation, wherein the channel barrier is configured to be rotatable around the axis of rotation. In one embodiment, each channel member 32 comprises a sidewall. The sidewalls or channel members 32 form channels therebetween. The channel barrier 30 further comprises a drive (not shown) connected to the channel barrier to rotate the channel barrier around the axis of rotation 31. The channel barrier is arranged with a cooling system 34 comprising a fluid, such as water. The cooling system is arranged on an outer surface of the channel barrier. A large cooling surface may result in more efficient cooling of the channel barrier members 32. In one embodiment, the channel barrier 30 is monolithic. Suitable ways to produce such channel barrier are brazing and welding. Monolithic channel barriers may be desirable for some applications because the main mechanism of heat transfer is by conduction, which is more efficient with respect to radiation.

Figure 4:
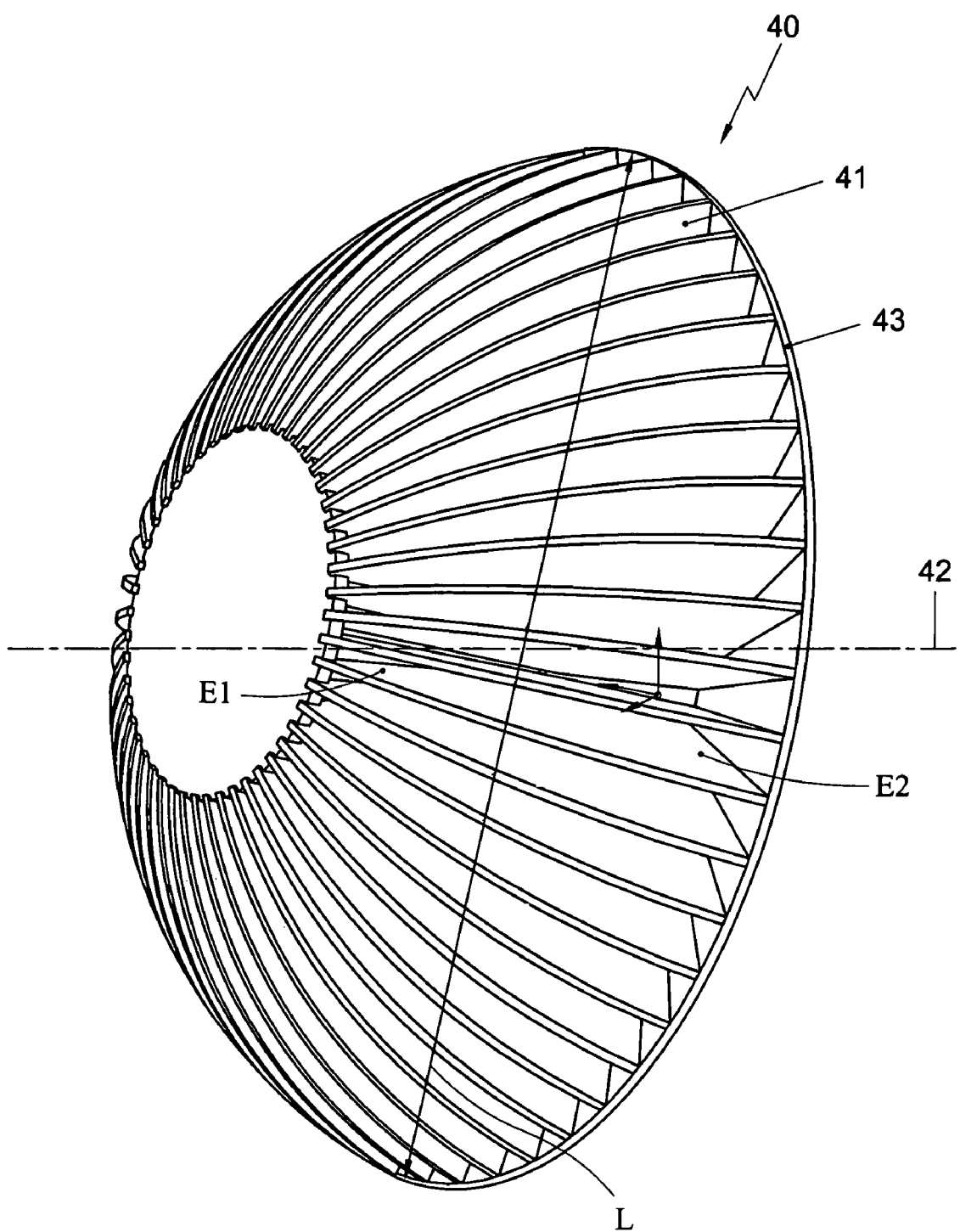
FIG. 4 presents schematically an embodiment of channel members.

FIG. 4 presents schematically an embodiment of channel members 40. The elongated channel members of the type 41 are mounted on a ceramics base 43. In one embodiment of the channel barrier, the channel members 41 are configured to be trapezoidal with a thinner portion E1 and a wider portion E2, whereby the thinner portion E1 is arranged at the source. This arrangement may allow thicker foils to be applied that allow superior heat transfer towards the cooled outer surface. In one embodiment, the channel members 41 are convex shaped with respect to the axis 42. A typical dimension L of the channel barrier in a direction perpendicular to the axis is about 200 mm.

Figure 5:
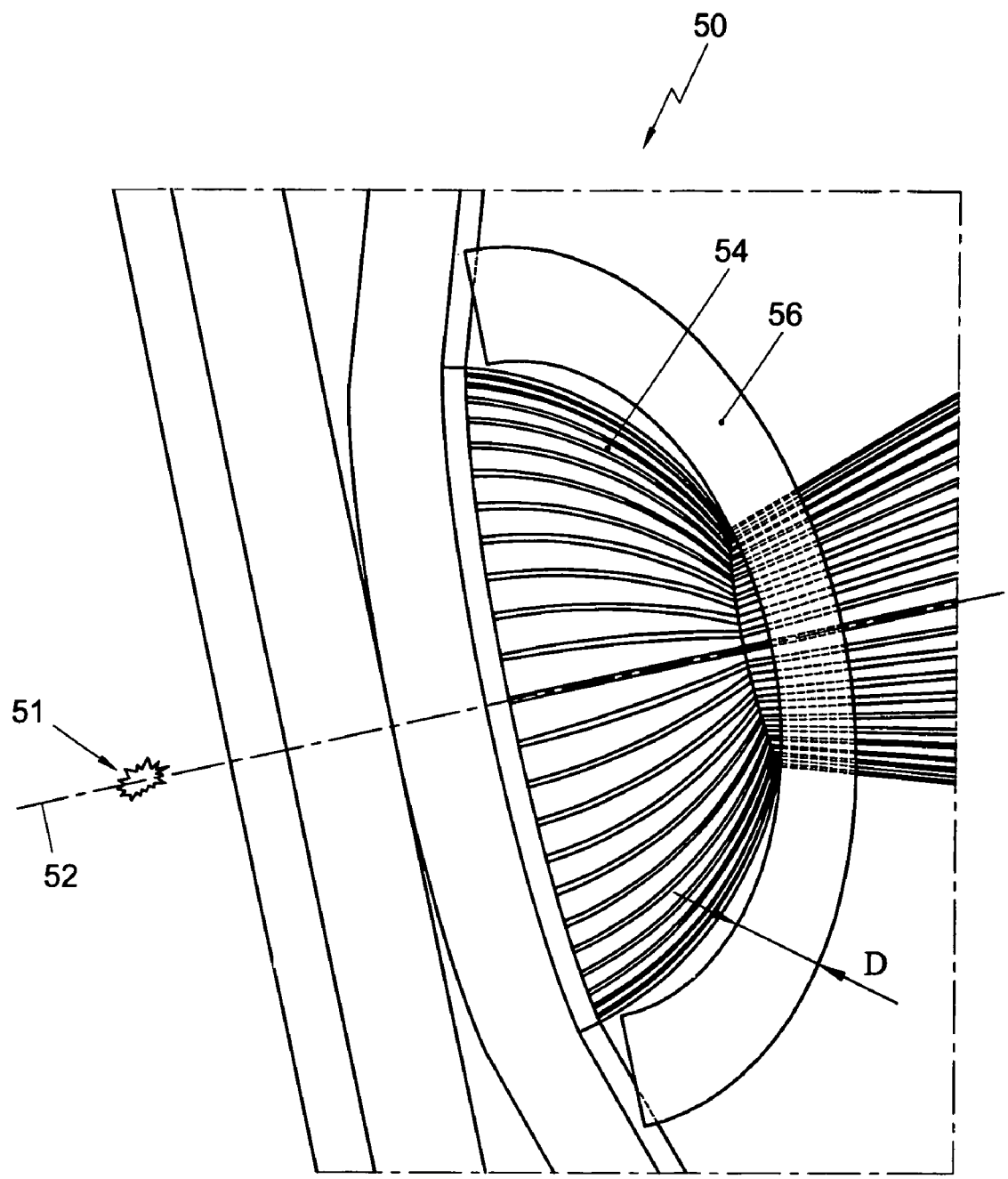
FIG. 5 presents schematically a 3D view of an embodiment of the channel barrier provided with a cooling device.

FIG. 5 presents schematically a 3D view of an embodiment of the channel barrier provided with a cooling device. The channel barrier 50 comprising channel members 54 may be rotatably arranged around the optical axis 52 of the optical system of the lithographic apparatus near a source of radiation 51. The channel members located close to the optical axis may form a honeycomb structure in a plane perpendicular to the optical axis, and may extend parallel or substantially parallel to the optical axis. A cooling system 56 is provided on an outer surface of the channel barrier. The cooling system may be designed as a disc-shaped structure having a thickness D of about 10 mm. The cooling system 56 enables the channel barrier to withstand heat loads of about 1-6 kW, which is substantially higher than what is attainable for channel barriers known in the art.

Figure 6:
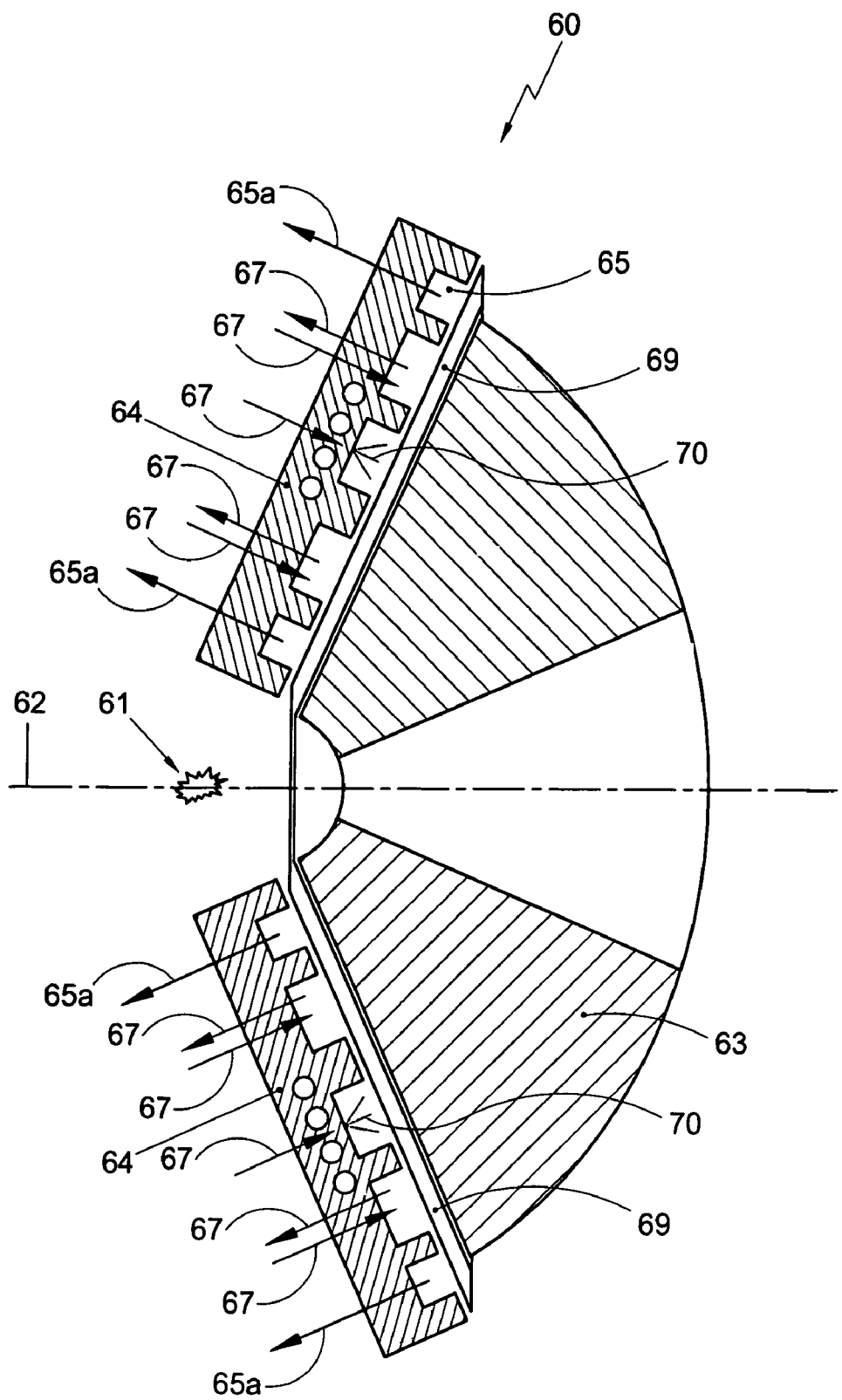
FIG. 6 presents schematically a cross-section of an embodiment of the channel barrier provided with a cooling device.

FIG. 6 presents schematically a cross-section of an embodiment of the channel barrier provided with a cooling device. The channel barrier 60 is arranged around the axis of rotation 62 near the source 61 of the EUV radiation. The channel barrier 60 comprises a plurality of channel members 63 arranged for preventing material (debris) emanating from the source 61 from propagating in the lithographic projection apparatus. To enable efficient cooling, the channel barrier comprises a cooling system 64 arranged for conducting a fluid, such as water, along the outer surface of the channel barrier. The cooling system 64 comprises a suitable plurality of conducts through which the fluid may flow inwardly and outwardly, as is schematically indicated by arrows 67 and 65a, respectively. A pump-down chamber 65 may also be provided for supplying used fluid to a suitable exit port (not shown). A characteristic pressure of the fluid at the pump-down chamber is less than about 0.1 bar. The cooling system 64 may also include a spraying arrangement 70 arranged to provide the coolant fluid at a pressure, thereby increasing the efficiency of the cooling due to addition of an evaporation mechanism. Suitable pressures for the spraying arrangement are about 0.1-3 bar, and preferably about 1 bar. The cooling system 64 may further comprise a dilution chamber 69 that is arranged for reducing partial pressure of water damps.

Figure 7:
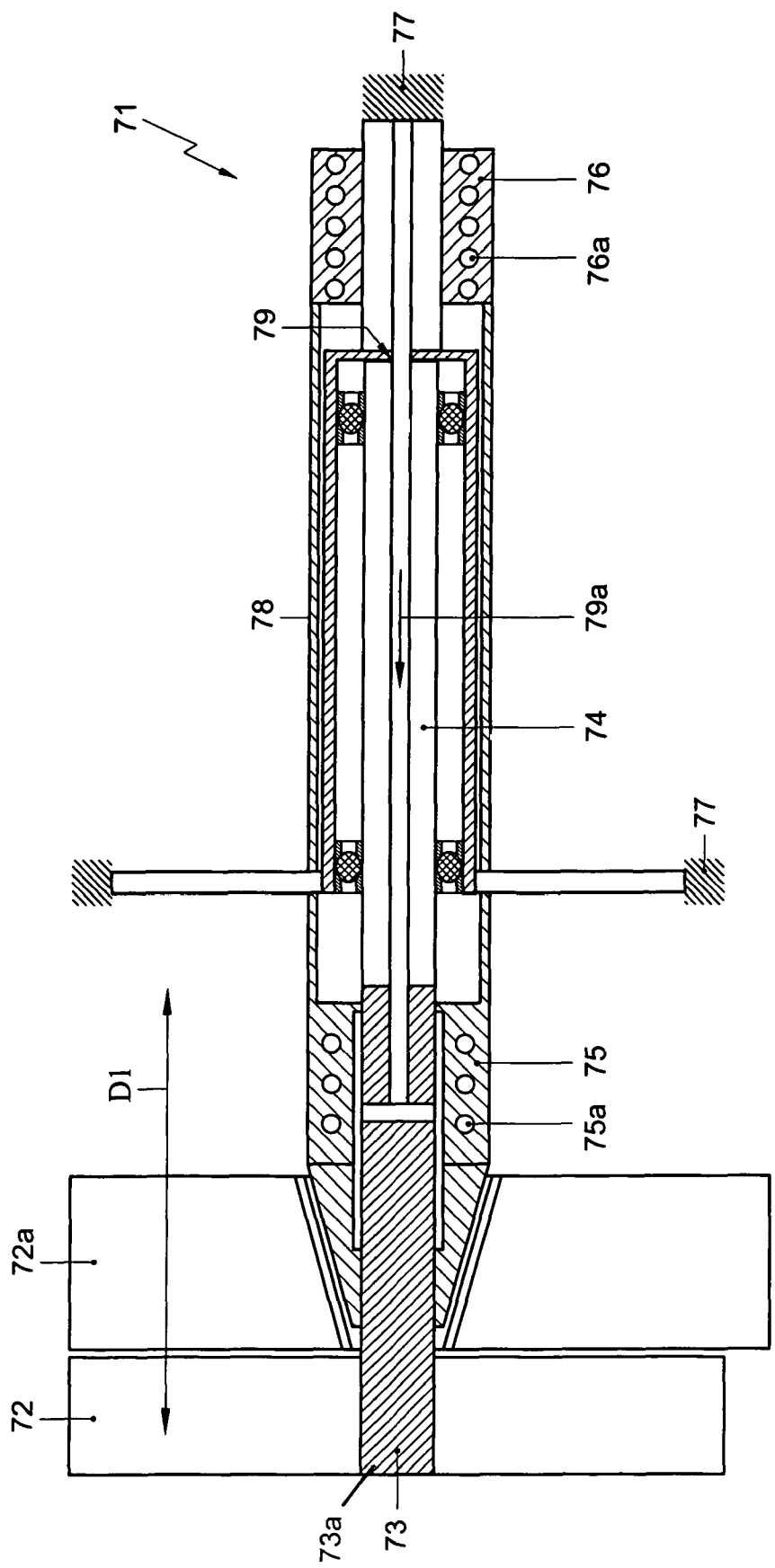
FIG. 7 presents schematically a cross-section of an embodiment of the contamination prevention system.

FIG. 7 presents schematically a cross-section of an embodiment of the contamination prevention system. The contamination prevention system 71 comprises a rotatable channel barrier 72, which is driven be means of a suitable drive, such as a motor. The system includes a bearing 83, which may be composed of two different materials 73a, 74. The contamination prevention system 71 may comprise an additional channel barrier 72a, which may be static or may be rotatable substantially around the same axis of rotation (not shown) as applicable for the channel barrier 73. The contamination prevention system 71 is mountable in a lithographic apparatus using spider wheels 77. A typical distance between a center of the channel barrier 72 and the spider wheels is about 100-150 mm. The contamination prevention system 71 may be arranged with a cooling system 75 provided substantially in a vicinity of the bearing 73. The cooling system 75 may comprise conducts 75a thorough which a suitable fluid coolant, such as gas, is provided. The gas may be supplied via a central channel 79a provided in a shaft 78 of the contamination prevention system. In one embodiment, at region 79, gas crosses from static mechanics to rotating mechanics. Additionally, a supplementary cooling system 76 may be provided in one embodiment. The supplemental cooling system 76 may be provided with suitable conducts 76a, Because this cooling system 76 is arranged on the periphery of the contamination prevention system 71, it may use water as a suitable coolant.

Figure 8:
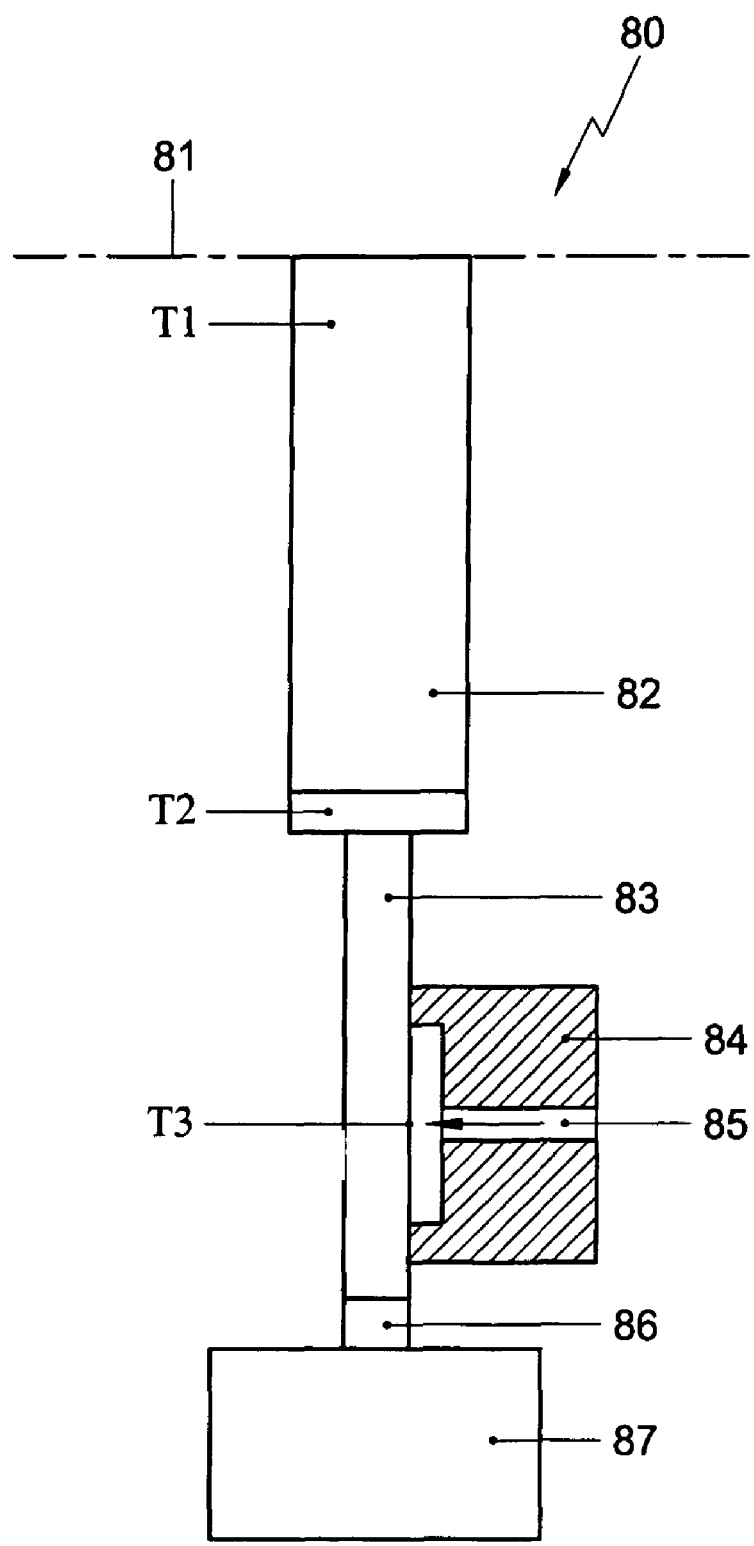
FIG. 8 presents schematically a cross-section of a further embodiment of the contamination prevention system.

FIG. 8 presents schematically a cross-section of a further embodiment of the contamination prevention system 80. For the sake of clarity, only a single channel barrier 82 is depicted. The contamination prevention system 80 may comprise a bearing 87 arranged to rotate the channel barrier 82 around an axis of rotation 81. The bearing 87 is attached to the channel barrier using a suitable metal plate 83, such as an aluminium plate. The bearing may be isolated from the rotating portion by an element 86 having high thermal resistance. It is noted that during a conventional mode of operation, the channel barrier 82 may be heated up to a temperature T1=800° C. By arranging the cooling system 84 having a fluid coolant, such as argon gas 85, the temperature may be substantially decreased towards radial periphery. Typical temperatures may be T2=200° C. and T3=130° C. Due to this arrangement, the durability of the bearing 87 may be substantially increased.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A contamination prevention system constructed and arranged to prevent material emanating from a radiation source from propagating with radiation from the radiation source into or within a lithographic apparatus, the contamination prevention system comprising:
   a channel barrier constructed and arranged to traverse the radiation from the radiation source, the channel barrier comprising a plurality of elongated channel members constructed and arranged to absorb or deflect the material, said channel members being rotatable around an axis of rotation by a drive connected to the channel barrier; and
   a cooling system provided on an outer surface of the channel barrier and arranged to conduct water along the outer surface of the channel barrier, the cooling system comprising
      a plurality of conducts through which water can flow towards the outer surface of the channel barrier and away from the outer surface of the channel barrier; and
      a dilution chamber arranged to reduce partial pressure of water damps.

2. A contamination prevention system according to claim 1, wherein the contamination prevention system is constructed and arranged so that the axis of rotation coincides with the optical axis of an optical system of the lithographic apparatus.

3. A contamination, prevention system according to claim 2, wherein the channel members located close to the optical axis form a honeycomb structure in a plane perpendicular to the optical axis and extend parallel or substantially parallel to the optical axis.

4. A contamination prevention system according to claim 2, wherein the drive is arranged on the optical axis, separately from a bearing.

5. A contamination prevention system according to claim 1, wherein the channel members are arranged parallel to a direction of propagation of the radiation.

6. A contamination prevention system according to claim 5, wherein the channel members are plate shaped.

7. A contamination prevention system according to claim 1, wherein the drive is arranged to rotate the channel barrier at a speed of between about 1 and about 200 rotations per second.

8. A contamination prevention system according to claim 1, further comprising a supplementary channel barrier mounted substantially coaxial with respect to the channel barrier.

9. A contamination prevention system according to claim 8, wherein the contamination prevention system is constructed and arranged so that the axis of rotation coincides with the optical axis of an optical system of the lithographic apparatus, the supplementary channel barrier being rotatably mounted with respect to the optical axis.

10. A contamination prevention system according to claim 9, wherein the supplementary channel barrier has a direction of rotation opposite to the direction of rotation of the channel barrier.

11. A contamination prevention system according to claim 1, wherein the channel barrier is monolithic.

12. A contamination prevention system according to claim 1, wherein the channel members are configured trapezoidal with a thinner portion arranged at the source.

13. A contamination prevention system according to claim 1, wherein the channel members are convex shaped with respect to the axis of rotation.

14. A contamination prevention system according to claim 1, further comprising a spraying arrangement arranged to provide the water at a pressure.

15. A contamination prevention system according to claim 14, wherein the pressure is about 0.1-0.3 bar.

16. A lithographic projection apparatus comprising:
a radiation source constructed and arranged to generate radiation; and
a contamination prevention system constructed and arranged to prevent material emanating from the radiation source from propagating with the radiation within the lithographic projection apparatus, the contamination prevention system comprising:
  a channel barrier constructed and arranged to traverse the radiation from the radiation source, the channel barrier comprising a plurality of elongated channel members constructed and arranged to absorb or deflect the material, said channel members being rotatable around an axis of rotation by a drive connected to the channel barrier, and
  a cooling system provided on an outer surface of the channel barrier and arranged to conduct water along the outer surface of the channel barrier, the cooling system comprising
    a plurality of conducts through which water can flow towards the outer surface of the channel barrier and away from the outer surface of the channel barrier; and
    a dilution chamber arranged to reduce partial pressure of water damps;
a patterning device constructed and arranged to pattern the radiation; and
a projection system constructed and arranged to project the patterned radiation onto a substrate at least partially covered with a radiation sensitive material.

17. A radiation system for a lithographic apparatus, the radiation system comprising:
a radiation source constructed and arranged to generate radiation; and
a contamination prevention system constructed and arranged to prevent material emanating from the radiation source from propagating with the radiation into or within the lithographic projection apparatus, the contamination prevention system comprising:
  a channel barrier constructed and arranged to traverse the radiation from the radiation source, the channel barrier comprising a plurality of elongated channel members constructed and arranged to absorb or deflect the material, said channel members being rotatable around an axis of rotation by a drive connected to the channel barrier, and
  a cooling system provided on an outer surface of the channel barrier and arranged to conduct water along the outer surface of the channel barrier, the cooling system comprising
    a plurality of conducts through which water can flow towards the outer surface of the channel barrier and away from the outer surface of the channel barrier; and
    a dilution chamber arranged to reduce partial pressure of water damps.

18. A method of manufacturing an integrated structure by a lithographic process, the method comprising:
generating radiation with a radiation source;
preventing material emanating from the radiation source from propagating with the radiation with a contamination prevention system comprising a channel barrier comprising a plurality of elongated channel members by absorbing or deflecting the material with the elongated channel members;
cooling the channel barrier of the contamination prevention system with a cooling system arranged on an outer surface of the channel barrier, the cooling system comprising
  a plurality of conducts through which water can flow towards the outer surface of the channel barrier and away from the outer surface of the channel barrier; and
  a dilution chamber arranged to reduce partial pressure of water damps;
patterning the radiation; and
projecting the patterned radiation onto a target portion of a substrate at least partially covered with a radiation sensitive material.

* * * * *